(12) United States Patent
Yadav et al.

(10) Patent No.: US 10,628,616 B2
(45) Date of Patent: Apr. 21, 2020

(54) SPACE PROFILE INTERPRETER FRAMEWORK FOR A COMPUTER FILE

(71) Applicant: Nuvolo Technologies Corporation, Jersey City, NJ (US)

(72) Inventors: Tejas Yadav, West Haven, CT (US); Tao Ye, Garfield, NJ (US); Asim Rizvi, Howell, NJ (US)

(73) Assignee: Nuvolo Technologies Corporation, Paramus, NJ (US)

( * ) Notice: Subject to any disclaimer, the term of this patent is extended or adjusted under 35 U.S.C. 154(b) by 0 days.

(21) Appl. No.: 16/193,757

(22) Filed: Nov. 16, 2018

(65) Prior Publication Data

US 2019/0213287 A1    Jul. 11, 2019

Related U.S. Application Data

(60) Provisional application No. 62/614,870, filed on Jan. 8, 2018, provisional application No. 62/614,857, filed on Jan. 8, 2018.

(51) Int. Cl.

| G06F 9/44 | (2018.01) |
|---|---|
| G06F 30/13 | (2020.01) |
| G06F 16/29 | (2019.01) |
| G06F 16/2455 | (2019.01) |
| G06F 30/00 | (2020.01) |
| G06F 8/41 | (2018.01) |
| G06F 8/51 | (2018.01) |
| G06F 8/75 | (2018.01) |

(52) U.S. Cl.
CPC .............. *G06F 30/13* (2020.01); *G06F 8/427* (2013.01); *G06F 8/51* (2013.01); *G06F 8/75* (2013.01); *G06F 16/2455* (2019.01); *G06F 16/29* (2019.01); *G06F 30/00* (2020.01)

(58) Field of Classification Search
CPC .............. G06F 8/51; G06F 8/75; G06F 9/451
See application file for complete search history.

(56) References Cited

U.S. PATENT DOCUMENTS

| 7,542,886 B2* | 6/2009 | Storms ................ G06F 17/5004 700/97 |
|---|---|---|
| 7,869,981 B2* | 1/2011 | Pendyala ........... G06Q 10/0875 703/1 |
| 9,384,308 B2* | 7/2016 | Snyder .................... G06F 30/13 |
| 2005/0071135 A1* | 3/2005 | Vredenburgh ...... G06F 17/5004 703/1 |

(Continued)

*Primary Examiner* — Duy Khuong T Nguyen
(74) *Attorney, Agent, or Firm* — Fish & Richardson P.C.

(57) ABSTRACT

A method for a space profile interpreter framework is described. The method includes a data interpreter module receiving a first data file having a data section that includes data representing real-world entities for a layer of a digital geographic structure. The data interpreter module communicates with a computing system for managing a location hierarchy. The module extracts location information included in multiple entity records for the layer. Each entity record corresponds to a respective space profile feature for a real-world entity of the digital geographic structure. A mapping module of a computing system associates the data item of the extracted location information with entity information of the location hierarchy managed by the computing system.

18 Claims, 5 Drawing Sheets

(56) References Cited

U.S. PATENT DOCUMENTS

| | | | | |
|---|---|---|---|---|
| 2005/0081161 | A1* | 4/2005 | MacInnes | G06F 17/5004 715/765 |
| 2006/0041842 | A1* | 2/2006 | Loberg | G06T 15/00 715/700 |
| 2008/0125892 | A1* | 5/2008 | Hoguet | G06Q 30/0601 700/98 |
| 2010/0268513 | A1* | 10/2010 | Loberg | G06F 17/5004 703/1 |

* cited by examiner

SPACE PROFILE INTERPRETER FRAMEWORK FOR A COMPUTER FILE

CROSS-REFERENCE TO RELATED APPLICATION

This application claims the benefit of U.S. Provisional Application No. 62/614,870, filed on Jan. 8, 2018.

This application claims the benefit of U.S. Provisional Application No. 62/614,857, filed on Jan. 8, 2018.

This application is related to U.S. Provisional Application No. 62/614,857, entitled "INTERPRETER FRAMEWORK FOR A COMPUTER FILE," filed on Jan. 8, 2018. The entire disclosure of U.S. Patent Application No. 62/614,857 is expressly incorporated by reference herein in its entirety.

BACKGROUND

This application relates to computing processes for converting electronic files.

DXF files are generated by an example computer-aided design (CAD) program (e.g., commercial CAD programs or drafting software applications) and encode data representations of real-world constructs. For example, the data representations can be two dimensional floorplans for a building, where the floorplans include different outlines for each room of a floor. Data representations of real-world constructs in separate DXF files can be encoded and arranged differently based on preferences and design choices used in the CAD program. Because data representations can be encoded in DXF files in a variety of ways, interpreting DXF files can be challenging.

SUMMARY

A computer application is described that can interpret spaces, sizes, entity information, and location details for rooms of a floor plan, or other items/features that can be represented in a DXF drawing file. For example, the application encodes a standardized method for identifying certain entity records of DXF files and for extracting relevant information from the entity records. The application parses the extracted information to obtain space profiles for features of a floorplan and matches or associates the space profile data with new or existing features and locations of floorplans stored in an asset management system.

One aspect of the subject matter described in this specification can be embodied in a computer-implemented method. The method includes, receiving, at a location interpreter module, a first electronic data file comprising a data section that includes data representing real-world entities for a layer of a digital geographic structure, and wherein the location interpreter module communicates with a computing system for managing a location hierarchy. The method further includes, extracting, by the location interpreter module, location information included in multiple entity records for the layer, each entity record corresponding to a respective space profile feature for a real-world entity of the digital geographic structure; and associating, by a mapping module of the computing system, a data item of the extracted location information with entity information of the location hierarchy managed by the computing system, the entity information being included in a data structure of the location hierarchy.

These and other implementations can each optionally include one or more of the following features. For example, in some implementations, associating the data item of the extracted location information with entity information of the location hierarchy includes: determining whether the data item matches the entity information included in the data structure of the location hierarchy; and in response to determining that the data item matches the entity information, associating, in the computing system, the data item with the entity information.

In some implementations, associating the data item of the extracted location information with entity information of the location hierarchy includes: determining whether the data item matches the entity information included in the data structure of the location hierarchy; in response to determining that the data item does not match the entity information, generating, in the computing system, a second data structure of the location hierarchy; and associating the data item with entity information of the location hierarchy by storing the data item in the second data structure.

In some implementations, extracting the location information included in multiple entity records for the layer includes: executing a parsing function to identify location information included in multiple respective entity records, the identified location information describing each of the respective space profile features, each space profile feature defining a geometry or attribute of the real-world entity represented by data included in the data section.

In some implementations, executing the parsing function to identify location information includes: generating a query string for the parsing function; and analyzing one or more of the multiple respective entity records to identify location information based on the query string, the location information relating to a particular graphical object. In some implementations, the particular graphical object at least partially defines a space profile feature, and wherein the query string is at least partially descriptive of the particular graphical object.

In some implementations, the layer of the digital geographic structure corresponds to a virtual floorplan representing a physical space of a real-world geographic structure. In some implementations, the respective space profile feature includes at least one of: i) a dimension of a room included in the virtual floorplan that represents the physical space; ii) a description of the room included in the virtual floor plan that represents the physical space; or iii) an asset assigned to the room.

Other implementations of this and other aspects include corresponding systems, apparatus, and computer programs, configured to perform the actions of the methods, encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that, when executed by a data processing apparatus, cause the apparatus to perform the actions.

The subject matter described in this specification can be implemented to realize one or more of the following advantages. DXF files can be interpreted so that spacing and location information can be obtained from the file irrespective of the different ways in which data is arranged within the files. The described standardized framework can be implemented to efficiently identify data within different sections of DXF drawings files, parse multiple entity records included in the data for the sections, and extract relevant location and spacing data from each of the multiple entity records. Extracted location information can be associated with new or existing data structures of a location hierarchy managed by an asset management system.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This document describes enhanced techniques for interpreting spacing and location information in a DXF drawing file such that information about floorplan features represented in the drawing file can be matched or associated with features of existing floorplans stored in an asset management system.

DXF files can include spacing, sizing, and location information for real-world constructs and the information can be extracted and matched with existing information about other real-world constructs. Despite current challenges with extracting and using spacing and location data from DXF files, a computer application is described that can interpret spaces, sizes, and location details for rooms and other features of a floor plan represented in a DXF drawing file. For example, the application encodes a standardized method for identifying certain entity records of DXF files and for extracting relevant information from the entity records. The application parses the extracted information to obtain space profiles for features of a floorplan and matches or associates the space profile data with new or existing features and locations of floorplans stored in an asset management system.

In general, data representations of real-world constructs in DXF files can also include space profile information for different locations and features of a floorplan. For example, space profile information for a room of a floorplan can describe the size of the room (e.g., square footage), the use of the room, or the types of physical assets or persons that are assigned to the room. Identifying and processing relevant size and location details of a DXF file to interpret the space profiles can be challenging. The described techniques include a space profile interpreter framework that overcomes these challenges and provides a specific computational process for interpreting space profiles of a drawing file generated by CAD programs.

The drawing files can have a DXF file format, where the files are formatted to include multiple data sections. The described interpreter framework can be represented by a computer application that receives the drawing file and uses a data/location interpreter module to identify the different data sections of the drawing file. For example, the drawing file may be used to view renderings of a building floorplan and each data section of the file can include information about a layer of the floorplan. A layer of a floorplan can include entity records that provide location and spacing data about items/features of the floorplan. For example, the location and spacing information can define a size of a room or types of assets that are assigned to the room. The application extracts spacing information about items of the floorplan and associates the extracted spacing information with a new or existing floorplan managed by an enterprise asset management (EAM) system.

The EAM system can include one or more location hierarchies. A location hierarchy can include an entity or asset database that includes information about multiple entities (e.g., real-world entities) for a given real-world geographic structure, such as a building or a university campus. For example, a location hierarchy for a building can include a database of entity information for multiple different assets included in the building, such as rooms, equipment, or floorplans. The application can interact with the EAM system to associate the extracted spacing information for entities of a floorplan in the DXF file with a new or existing floorplan of a location hierarchy managed by the EAM system. The existing floorplan (A) of the location hierarchy can be a floorplan that matches the floorplan (B) of the DXF file from which entity spacing information was extracted.

As used in this document, the space profile interpreter framework can represent a specific set of computer-implemented rules for a standardized method of interpreting and extracting spacing and location data from a DXF file. The framework enables the automation of specific computer-related DXF file interpretation and conversion tasks that previously could not be performed by computer systems in an efficient manner. The framework improves computer-based data extraction processes by enabling different arrangements of data representations in a DXF file to be automatically identified and extracted for use by an asset management system. Also, the described techniques provide a repeatable automated process that involves minimal human intervention and does not require manual execution of data identification, parsing, or extraction functions. As such, the techniques enable computing systems to perform operations that the systems were previously unable to automatically perform due to the challenges of developing standardized methods for obtaining spacing and location from DXF files.

Figure 1:
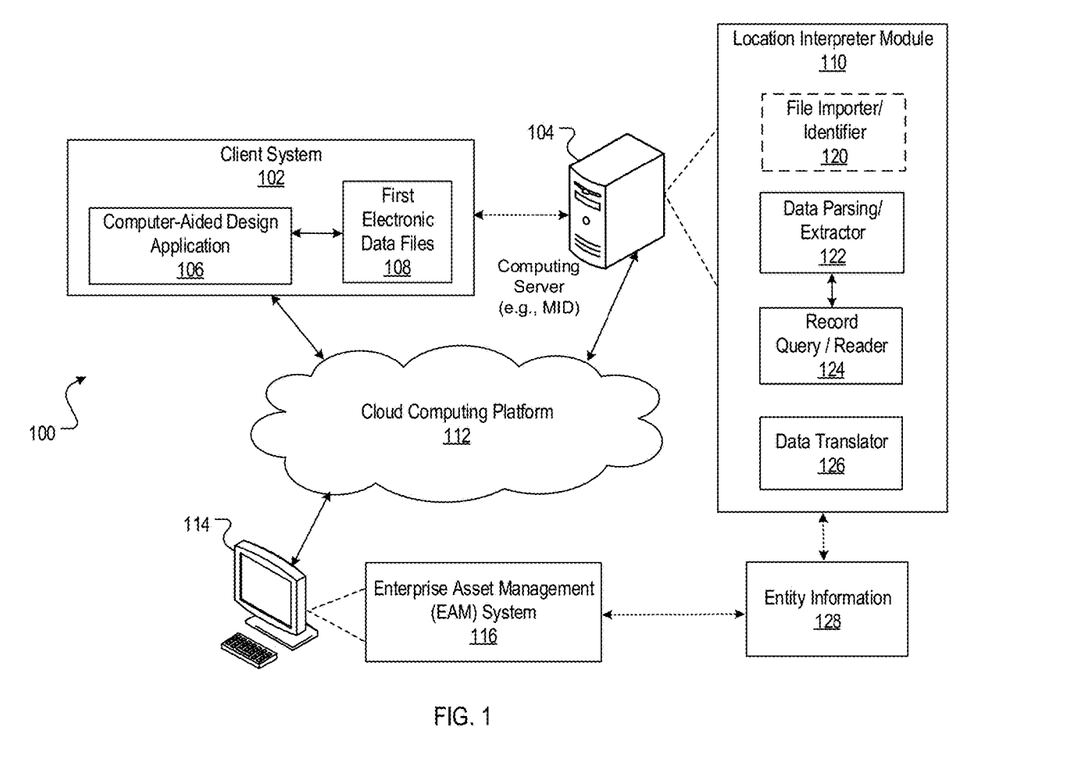
FIG. 1 illustrates an example computing system for executing an interpreter framework to obtain space profile data from one or more files.

FIG. 1 illustrates an example computing system 100 for executing an interpreter framework to obtain space profile data from one or more files. The system 100 generally includes a client system 102, a computing server 104, a cloud computing platform 112, a client device 114, and an enterprise asset management (EAM) system 116. EAM is the management of the physical (and virtual) assets of an organization or business enterprise. Asset management can cover concepts including the design, construction, commissioning, operations, maintenance, decommissioning, or replacement of assets such as electronic devices, mechanical equipment, or facilities. An example EAM system 116 can execute software programs that provide asset managers with computer-based options for holistically viewing and managing a variety of different company-owned resources.

In general, the platform 112 can correspond to a cloud-based computing system. For example, the platform 112 can enable access to certain application programs and code scripts for performing various data processing operations. In addition, the platform 112 can facilitate or enable the sharing of data communications between client and server devices of system 100.

The client system 102 can generally include one or more client devices 114. Any of the client devices 114 can be a desktop computer, a laptop computer, a tablet device, a smart computer device, or one of other related electronic devices that are configured to execute example design application programs. The client system 102 executes a computer-aided design application 106 for generating one or more electronic data files 108. In some implementations, the application 106 is an example computer-aided design (CAD) program (e.g., commercial CAD programs or drafting software applications) and the electronic data files 108 are DXF files generated by the CAD program. As described in further detail below, the DXF files are drawing files that encode data representations of real-world constructs.

The computing server 104 includes a data/location interpreter module 110 ("location interpreter 110") and is generally configured to exchange data, including electronic data files, with the client system 102. The server 104 is configured to access, implement, and/or execute the location interpreter 110. For example, the server 104 can obtain or receive one or more data files 108 from the client system 102. As described in more detail below, the server 104 can cause the location interpreter 110 to execute specific computing processes for a space profile interpreter framework. Using the location interpreter 110, the server 104 can process a first data file 108 in order to generate corresponding datasets of entity information 128.

For example, the server 104 uses the location interpreter 110 to execute specific computing rules to receive and process the data file 108 (e.g., a DXF file) to identify and extract entity spacing and location information for generating datasets of entity information 128. A data file 108 can be a drawing file generated by a particular type of application 106 (e.g., a CAD program) and can include data for encoding one or more graphical objects. The data files 108 can have a file format for enabling interoperability between drawing files generated by the application 106 and one or more other application programs. In particular, the file format can be a drawing exchange format (DXF) which indicates file characteristics of the data files 108.

By implementing processes described in this document, a user can leverage the interoperability afforded by the DXF file format to interpret and extract information included in the data file 108, e.g., a DXF drawing file, to generate the entity information 128. Entity information 128 can correspond to detailed information about distinct real-world entities (described below) that are represented by data for a layer of a digital geographic structure (also described below). Data representing a real-world entity can be an entity record or a data object of a DXF drawing file. An example entity record can represent a graphical data structure for depicting lines and boundaries which define physical features of real-world constructs.

Data for a layer can include multiple entity records, where each entity record corresponds to a respective space profile feature for a real-world entity of the digital geographic structure. In some implementations, the layer of the digital geographic structure corresponds to a virtual layout (or floorplan) representing physical spaces of a real-world geographic structure, such as a building, a university campus, a server farm, or even a state or country. The respective space profile feature for each entity can include one or more of: i) a dimension of a room included in the virtual floorplan that represents the physical space; ii) a description of the room included in the virtual floor plan that represents the physical space; or iii) an asset assigned to the room.

While in typical implementations, the location interpreter 110 is encoded on computer-readable media, in some implementations, the location interpreter 110 is included within the server 104 as a sub-system of hardware circuits that includes one or more processing devices or processor microchips. In general, the server 104 can include processors, memory, and data storage devices that collectively form modules and computer systems of the server 104. Processors of the computer systems process instructions for execution by the server 104, including instructions stored in the memory or on the data storage device to display graphical information for output at an example display monitor of system 100.

Execution of the stored instructions can cause one or more of the actions described herein to be performed by the server 104 or the location interpreter 110. In other implementations, multiple processors may be used, as appropriate, along with multiple memories and types of memory. For example, the server 104 may be connected with multiple other computing devices, with each device (e.g., a server bank, groups of servers, modules, or a multi-processor system) performing portions of the actions, operations, or logical flows described in this specification.

The location interpreter 110 executes a space profile interpreter framework for obtaining entity spacing and location information from a DXF drawing file. The location interpreter 110 processes programed instructions for executing a file importer 120, a data extractor 122, a query logic 124, and a data translator 126. As described in more detail below with reference to FIG. 2, the location interpreter 110 uses the importer 120 to receive or obtain the data file 108 from the client system 102. The data file 108 can be a DXF drawing file that is formatted to include multiple data sections. Using the programmed instructions, the data location interpreter 110 executes the space profile interpreter framework for obtain the entity spacing and location data to generate entity information 128.

For example, location interpreter 110 generates entity information 128 by using importer 120 to identify certain sections of the DXF file and then using data extractor 122 to parse and extract entity records included in data for the identified sections. Query logic 124 can be used to query each entity record to obtain particular types of entity specific data from the entity record. Data translator 126 interprets the extracted data and uses coded scripts to translate the data to a desired format for generating entity information 128.

Figure 2:
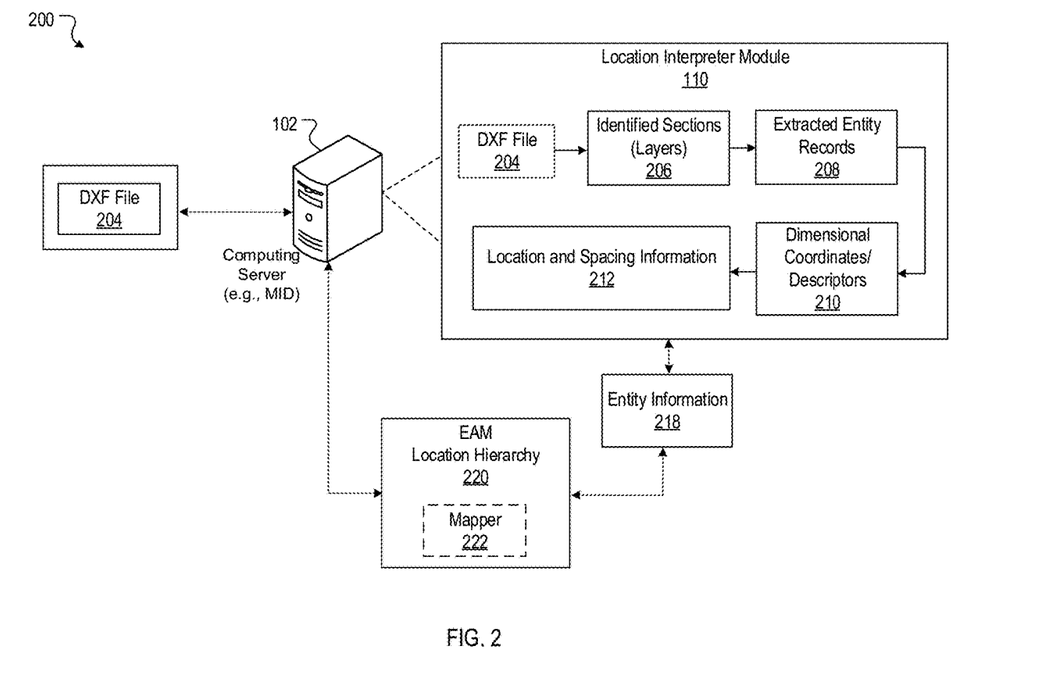
FIG. 2 illustrates an interpreter module of the example computing system of FIG. 1.

FIG. 2 illustrates the location interpreter 110 of the computing system 100 described above with reference to FIG. 1. In particular, FIG. 2 shows an interpreter framework 200 used by the location interpreter 110 to obtain space profile information, such as entity spacing data, entity location data, and asset data, from a DXF file 204. Framework 200 includes the location interpreter 110 receiving a DXF drawing file 204. The location interpreter 110 imports or receives file 204 using the server 104. In some implementations, the server 104 uses computing services enabled by the cloud computing platform 112 to access the file 204 from the client system 102 and to access the location interpreter 110.

Additional details describing technical aspects of, and the interplay between, the client system 102, the importer 120, the server 104, and the cloud computing platform 112 are described in related U.S. Provisional Application No.

62/614,857, entitled "INTERPRETER FRAMEWORK FOR A COMPUTER FILE." The additional details and descriptions of the interplay between these devices and modules are also expressly incorporated by reference herein.

To perform the framework 200, the location interpreter 110 receives the DXF file 204 (e.g., a drawing file) from client system 102. The file 204 includes multiple respective data sections that can represent layers or other aspects of a DXF drawing file. Individual layers of a drawing file correspond to physical features or other characteristics of real-world constructs, such as plumbing or electrical lines of a building. In addition to the layers, the file 204 can include various types of data that can represent real-world entities. As used herein, real-world entities represent actual physical and non-physical items/things of the real world that can be graphically rendered and displayed (e.g., at a computer system display monitor) as a computer-generated object. Examples of a real-world entity include a layout of a floor of a building, a campus location, buildings at the campus, rooms of the building, a computing device positioned in a room, a detectable wireless signal range of the computing device, or plumbing lines of the building.

The location interpreter 110 identifies each data section 206 that is associated with a particular layer of the DXF file 204. For example, the location interpreter 110 uses the identifier 120 to perform data processing and streaming operations for identifying data sections 206 of file 204. In some implementations, data for the various data sections of file 204 are streamed to the compute blocks of the location interpreter 110 and processed in real-time. In other implementations, each compute block consumes an entire file 204 by storing the file in memory and then processing the file 204 to perform a particular operation for interpreting data for a given layer.

The file 204 can define multiple layers that each include information about features of a digitally renderable real-world entity (e.g., a geographic structure or location). In some implementations, each layer includes spacing and location information that defines a virtual boundary of the feature of the digitally rendered real-world entity. For example, a layer can be associated with a physical building, a floorplan, or campus location floorplan, and the feature (e.g., a space profile feature) can correspond to a shape of at least a portion of the particular real-world entities for that layer.

The location interpreter 110 parses and extracts the entity records 208 from the identified data sections 206 that correspond to a particular layer of the file 204. Each entity record can include specific types of entity data that provide information about real-world entities represented by the data in file 204. As noted above, each entity record corresponds to a respective space profile feature for a real-world entity of a digital geographic structure.

For example, each entity record can include information representing space profile features for an entity. Space profile features can be dimensions of a room included in a virtual floorplan representing a physical space; ii) descriptions of the room included in the virtual floor plan; or iii) assets assigned to the room in the virtual floorplan. Hence, entity records include space profile features such as data values for depicting lines and boundaries that define spaces, dimensions, or physical features of real-world constructs. Entity records can also include descriptions and other characteristics associated with a real-world entity.

In some implementations, a digital geographic structure depicts a real-world entity (or multiple real-world entities) and is computer-generated for graphical rendering and display using a computer system. Moreover, as used in this document, real-world entities represent actual physical and non-physical items/things of the real-world that can be graphically rendered and displayed as a computer-generated object. Examples of a real-world entity include items in a layout of a floor of a building, a campus location, buildings at the campus, rooms of the building, a computing device positioned in a room, a detectable wireless signal range of the computing device, or plumbing lines of the building.

For clarity, data representing real-world entities relates to electronic data for producing the computer-generated objects that are graphically displayed using a computer system. Hence, data representing real-world entities is different than the actual physical (and non-physical) items that correspond to the real world entities. In some implementations, real-world entities can indicate signal coverage ranges, sprinkler system ranges, or physical attributes and dimensions of real-world construct. For example, the information 208 about real-world entities extracted from the file layers can: i) define an outline of the real-world entity, e.g., size or shape of the entity, or ii) is descriptive of the real-world entity, e.g., indicates a Wi-Fi signal range or identifies a type of electrical line.

The location interpreter 110 uses the data extractor 122 to extract entity records for a layer and forms sets of entity records 208 based on this data extraction. Further, the data extractor 122 can parse and extract location information included in the multiple extracted entity records 208 for the layer. As described above, each entity record includes space profile features that can define location information for a real-world entity. The location information (or space profile information) generally includes spacing data for an entity (e.g., a real-world entity), location data for an entity, descriptions relating to an entity, asset information for an entity, or combinations of each.

For example, an entity can be a physical space such as a room of a building. In this context, spacing data for the entity/room can be the square footage or approximate size of the room, location data for the entity can indicate the room's relative location within the building, descriptions relating to the entity can identify the name of the room or persons that are assigned to the room, and asset information for the entity can indicate that types of physical (or non-physical assets) that are assigned to the room. Alternatively, an entity can be a non-physical item such as a Wi-Fi or radio signal range. In this context, spacing data for the entity/signal range can be the approximate area that is covered by the signal range, while asset information for the entity can indicate the type of hardware transmitter that is providing the Wi-Fi or radio signal.

In some implementations, data extractor 122 is configured to execute a parsing function to identify location information included in the multiple respective entity records 208 (e.g., by scanning, reading, or otherwise analyzing the data of the entity records). The identified location information can describe each of the respective space profile features. Each space profile feature can include data values that define a geometry, dimensional coordinates, or other physical attributes of an entity, as well as non-physical attributes (e.g., descriptions and labels) for an entity. In some implementations, executing the parsing function includes using query logic 124 to identify location information of an entity record.

For example, data extractor 122 can interact with query logic 124 to generate a query string for the parsing function. A query string can be generated using bounded shapes and overlaying texts on a CAD file. The query string can be used to analyze respective entity records to identify location information that match one or more terms of the query string, such as terms associated with the text overlaid on the CAD file. In some instances, the parsing function can be used to read all extracted entity records 208 based on a particular query statement. For example, the query statement can be constructed to read data values of the entity records to identify a particular type of "polyline" that may be included in the entity records. In some implementations, the identified location information relates to a particular graphical object, e.g., a room outline defined by multiple polylines. The particular graphical object can at least partially define a space profile feature (e.g., a line segment of a room outline) and the query string/statement can be at least partially descriptive of the particular graphical object.

Using the entity records 208, the data extractor 122 extracts geometric and dimensional coordinates and other descriptive information 210 for a real-world entity. For example, as indicated above, each entity record may include data for a shape or space profile feature of the real-world entity, where the data includes dimensional coordinates (or other data) defining an outline (or other characteristics) of the real-world entity. The data translator 126 is used to process and aggregate the extracted location and spacing information 212 in order to generate the entity information 218. In some implementations, the location and spacing information 212 can be processed and converted to have a format (e.g., a GeoJSON file format) that can be used by the EAM system 116 to view and modify existing representations of real-world constructs.

The EAM system 116 can modify existing representations, or create new representations, of real-world entities and buildings using the entity metadata, location data, spacing data, and/or asset information included in the entity information 218. In some implementations, the client device 114 is used to interface with the EAM system 116 to manage existing location hierarchies 220 or to create new data structures and new location hierarchies 220 based on data items included in entity information 218.

The mapping module 222 can be a data processor (e.g., a software module that processes data) that uses programed instructions to scan or analyze an existing asset database for information about assets (e.g., real-entities) of a location hierarchy 220. The module 222 can also analyze extracted information about real-world entities identified in the entity information 218. Based on the scanning and analysis, the module 222 can determine relationships between the entities and assets of the database and the real-world entities included in the entity information 218. For example, a relationship between the asset and the real-world entity can be defined based on the asset and the entity being associated with the same building, virtual floorplan, or layer of the location hierarchy 220.

The EAM system 116 uses a mapping module 222 of the system 100 to associate entities and assets managed by the enterprise system with features of a real-world entity represented in the DXF file 204. In some implementations, entity or asset information of a location hierarchy 220 can be included in at least one data structure of the location hierarchy. In general, the module 222 can associate the entities and assets of the location hierarchy 220 with real-world entities using determined relationships between the entity/asset data and the real world entities identified in entity information 218.

For example, the module 222 associates a data item of location information extracted from file 204 with asset information of the location hierarchy 220 based on one or more determinations. In some implementations, the module 222 determines whether the data item matches entity or asset information included in a data structure of the location hierarchy 220. In response to determining that the data item matches the entity or asset information, the module 222 can associate the data item with the entity or asset information.

As an example, the data structure of location hierarchy 220 can include entity information for building A and multiple rooms in building A. The extracted data item of the location information can include dimensions for real-world entities, such as the same building A and one of the multiple rooms in building A. Hence, the module 222 determines that the extracted data item includes a least a portion of entity information that matches the entity information included in the data structure of the location hierarchy 220, namely, the same building A. Based on this determination, information in the extracted data item describing dimensions and other data for the room in building A is then associated with the multiple other rooms for building A that are included in the location hierarchy 220.

In some implementations, the module 222 may determine that the extracted data item does not match any existing entity or asset information included in location hierarchy 220. In response to making this determination, the module 222 can generate or create a new data structure for identifying real-world entity information included in the data item. The module 222 can then associate the data item with other entities and assets of the location hierarchy at least by storing the new data structure in an asset database of the location hierarchy 220.

Figure 3:
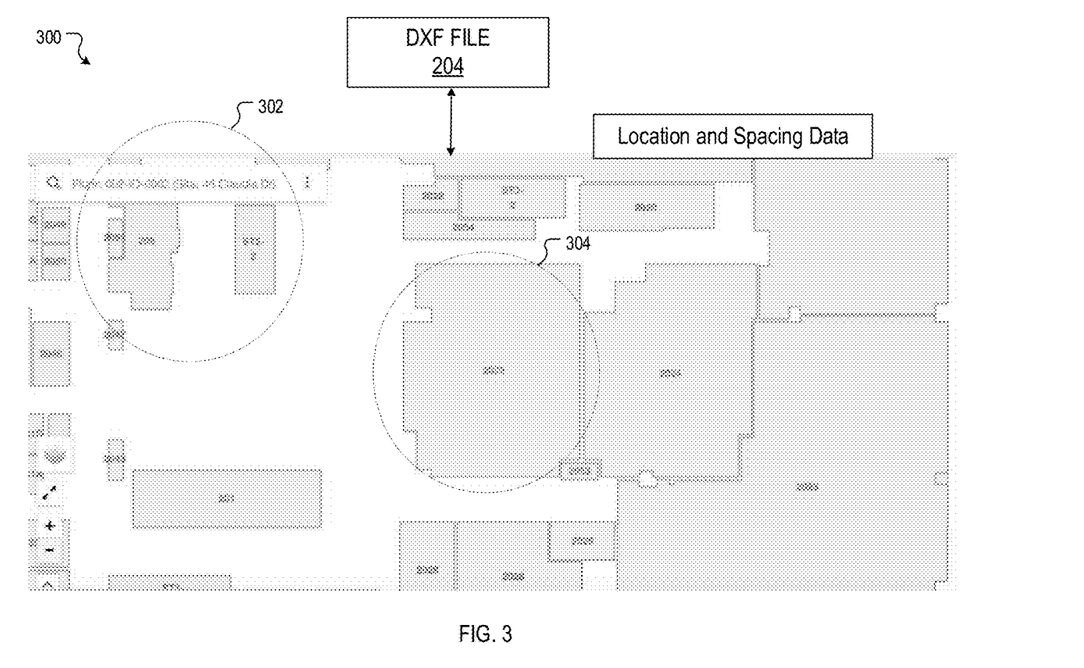
FIG. 3 illustrates an example floorplan represented by a DXF file.

FIG. 3 illustrates an example floorplan represented by a DXF file. The diagram 300 can include data representations of real-world entities for at least a floorplan layer of the DXF file 204. For example, the data representations can be two dimensional renderings of floorplans for a building, where the floorplans include different outlines 302, 304 for each room, or sets of rooms, included at a floor in the building. In some implementations, data representations of other real-world entities associated with a layer of the file 204 can include an example Wi-Fi or cellular signal coverage range, electrical lines, plumbing fixtures, desks and chairs, or computers and other electronic devices.

Figure 4:
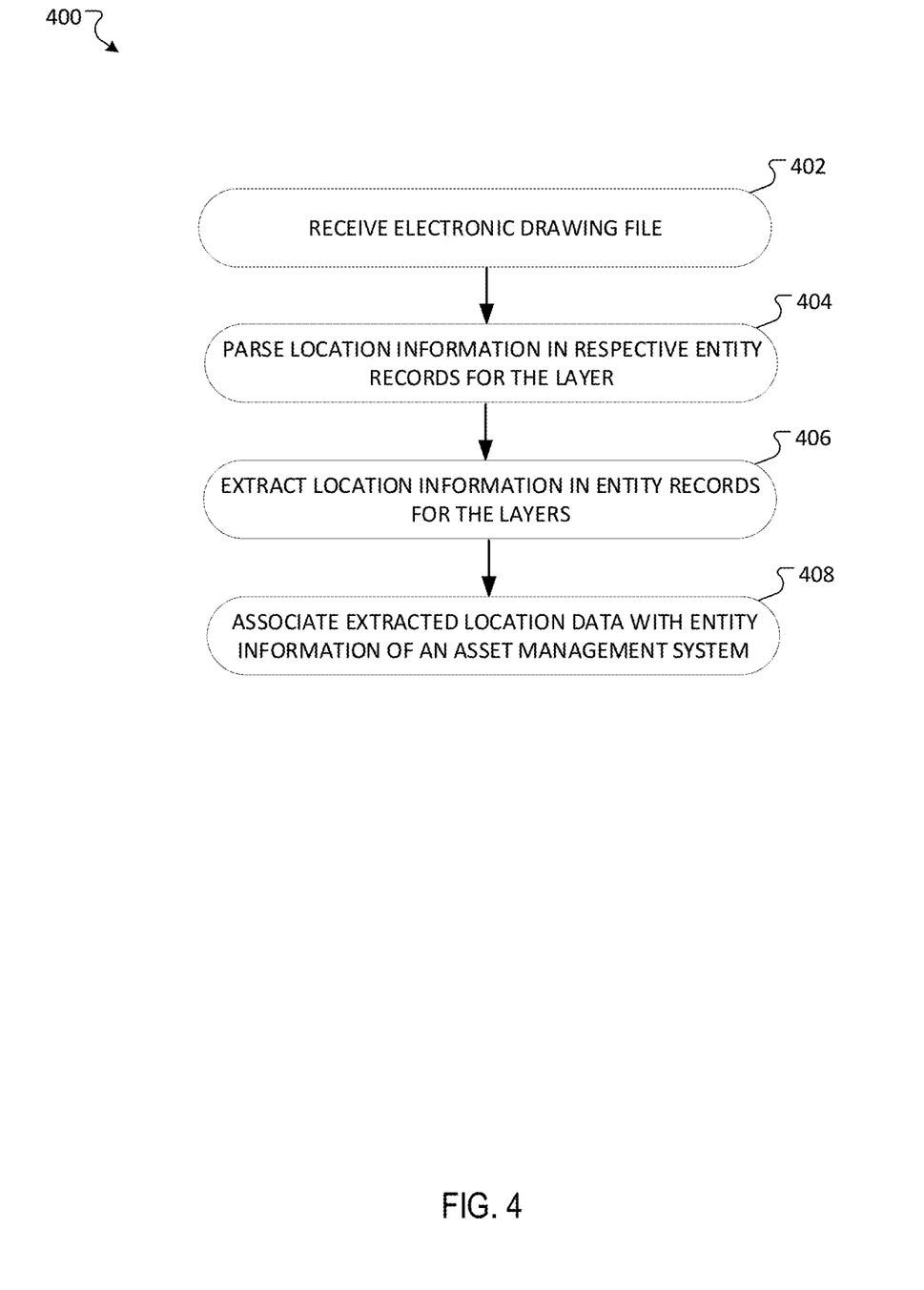
FIG. 4 is a flow chart of a process for executing an interpreter framework to obtain space profile data from one or more files.

FIG. 4 is a flow chart of a process 400 for executing an interpreter framework to obtain space profile data from one or more files. The process 400 can be performed or executed, for example, using systems 100 and 200 described above. In some implementations, described actions of process 400 are enabled by programmed software instructions that are executable by at least one processing device and memory of computing systems described in this document.

The process 400 includes the location interpreter 110 of the system 100 receiving a first electronic data file (402). The data file can have one or more data sections and each data section includes data representing real-world entities for a layer of a digital geographic structure. As noted above, the digital geographic structure can depict a real-world entity (or multiple real-world entities) and is computer-generated for graphical rendering and display using a computer system. The location interpreter 110 communicates with a computing system for managing a location hierarchy. For example, the interpreter 110 communicates with the EAM system 116 that manages at least one location hierarchy 220.

The location interpreter 110 parses location information included in multiple entity records for the layer (404). For example, the location interpreter 110 can execute a parsing function to identify location information included in multiple respective entity records. The identified location information describes each of the respective space profile features. Each space profile feature can define a geometry or attribute of the real-world entity represented by data included in the data section.

The location interpreter 110 extracts the parsed location information included in the multiple entity records for the layer (406). Each entity record can correspond to a respective space profile feature for a real-world entity of the digital geographic structure. The layer of the digital geographic structure can correspond to a virtual floorplan that represents a physical space of a real-world entity (e.g., a building). In some implementations, the respective space profile feature includes: i) a dimension of a room included in the virtual floorplan that represents the physical space; ii) a description of the room included in the virtual floor plan that represents the physical space; iii) an asset assigned to the room; or iv) combinations of items i) through iii).

A mapping module of the system 100 associates a data item of the extracted location information with entity information of the location hierarchy 220 that is managed by the EAM system 220 (408). The entity information can be included in a data structure of the location hierarchy 220. In some implementations, associating the data item of the extracted location information with entity information of the location hierarchy 220 includes determining whether the data item matches the entity information included in the data structure of the location hierarchy 220. In response to determining that the data item matches the entity information, the EAM system 220 will then associate the data item with the entity information.

Figure 5:
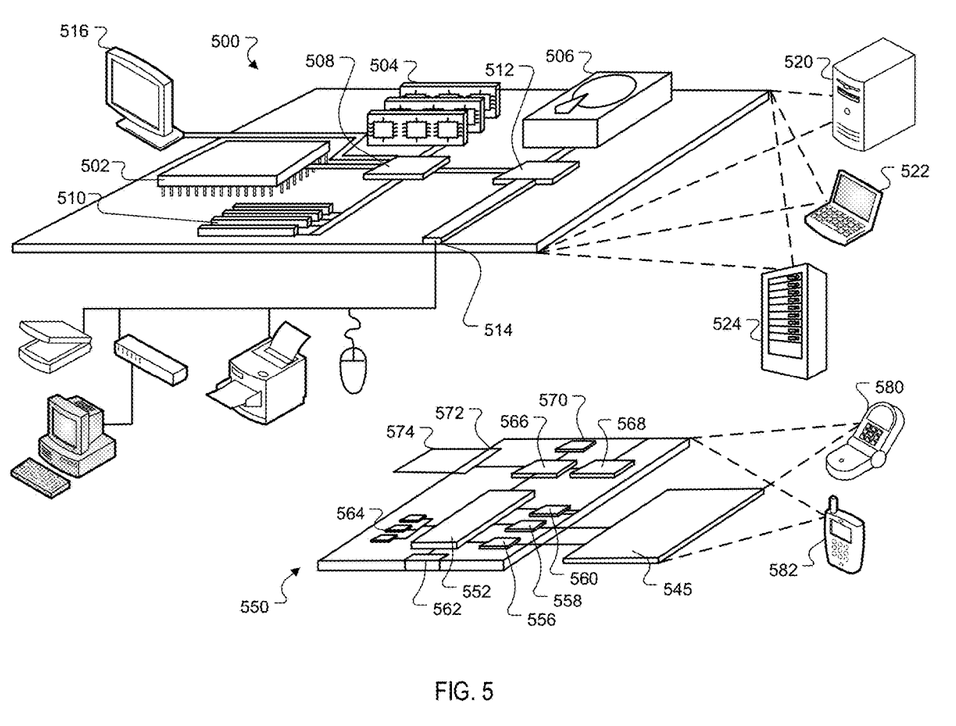
FIG. 5 is a block diagram of a computing system that can be used in connection with methods described in this specification.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations, e.g., as a server bank, a group of blade servers, or a multi-processor system.

The memory 504 stores information within the computing device 500. In one implementation, the memory 504 is a computer-readable medium. In one implementation, the memory 504 is a volatile memory unit or units. In another implementation, the memory 504 is a non-volatile memory unit or units.

The storage device 506 is capable of providing mass storage for the computing device 500. In one implementation, the storage device 506 is a computer-readable medium. In various different implementations, the storage device 506 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of duties is exemplary only. In one implementation, the high-speed controller 508 is coupled to memory 504, display 516, e.g., through a graphics processor or accelerator, and to high-speed expansion ports 510, which may accept various expansion cards (not shown). In the implementation, low-speed controller 512 is coupled to storage device 506 and low-speed expansion port 514. The low-speed expansion port, which may include various communication ports, e.g., USB, Bluetooth, Ethernet, wireless Ethernet, may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can process instructions for execution within the computing device 550, including instructions stored in the memory 564. The processor may also include separate analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD display or an OLED display, or other appropriate display technology. The display interface 556 may include appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication, e.g., via a docking procedure, or for wireless communication, e.g., via Bluetooth or other such technologies.

The memory 564 stores information within the computing device 550. In one implementation, the memory 564 is a computer-readable medium. In one implementation, the memory 564 is a volatile memory unit or units. In another implementation, the memory 564 is a non-volatile memory unit or units. Expansion memory 574 may also be provided and connected to device 550 through expansion interface 572, which may include, for example, a SIMM card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS receiver module 570 may provide additional wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound, e.g., voice messages, music files, etc., and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back-end component, e.g., as a data server, or that includes a middleware component such as an application server, or that includes a front-end component such as a client computer having a graphical user interface or a Web browser through which a user can interact with an implementation of the systems and techniques described here, or any combination of such back-end, middleware, or front-end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

As used in this specification, the term "module" is intended to include, but is not limited to, one or more computers configured to execute one or more software programs that include program code that causes a processing unit(s)/device(s) of the computer to execute one or more functions. The term "computer" is intended to include any data processing or computing devices/systems, such as a desktop computer, a laptop computer, a mainframe computer, a personal digital assistant, a server, a handheld device, a smartphone, a tablet computer, an electronic reader, or any other electronic device able to process data.

A number of embodiments have been described. Nevertheless, it will be understood that various modifications may be made without departing from the spirit and scope of the invention. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

The invention claimed is:

1. A computer-implemented method, comprising:
   receiving, at a location interpreter module of a first system, a drawing file comprising a plurality of file layers;
   storing the drawing file in a memory of the first system;
   processing contents of the drawing file after storing the drawing file; for each file layer of the plurality of file layers:
      identifying multiple entity records included at the file layer in response to processing the contents of the drawing file, each entity record comprising discrete data values used to render physical location attributes for real-world entities of a digital geographic structure;
   extracting, by the location interpreter module, data values of location information included in one or more of the multiple entity records for the file layer, each extracted data value corresponding to a respective physical space profile feature for a real-world entity of the digital geographic structure, and wherein at least one file layer corresponds to a virtual floorplan that represents a physical space of a real-world geographic structure that corresponds to the digital geographic structure;
   transmitting, from the first system and to a second, different system, the extracted data values, wherein the second system is configured to manage data structures of a location hierarchy that are mapped to the real-world entities of the digital geographic structure; and
   modifying, by a mapping module of the second system, information stored in a first data structure of the location hierarchy based on the extracted data values for the physical space profile feature of the real-world entity.

2. The method of claim 1, wherein modifying the information stored in the first data structure of the location hierarchy comprises:
   determining whether the real-world entity for which the data values were extracted matches an entity stored in the location hierarchy based on entity information included in the first data structure of the location hierarchy; and
   in response to determining that the real-world entity matches the entity stored in the location hierarchy, modifying the information stored in the first data structure by associating, in the second system, the extracted data values for the physical space profile feature of the real-world entity with the entity information.

3. The method of claim 2, comprising:
   determining whether the real-world entity for which the data values were extracted matches an entity stored in the location hierarchy based on entity information included in the first data structure of the location hierarchy;
   in response to determining that the real-world entity for which the data values were extracted does not match the entity stored in the location hierarchy, generating, in the second system, a second data structure of the location hierarchy; and
   associating the extracted data values for the physical space profile feature of the real-world entity with entity information of the location hierarchy by storing the extracted data values in the second data structure.

4. The method of claim 1, wherein extracting the data values of location information included in one or more of the multiple entity records for the file layer comprises:
   executing a parsing function to identify location information included in multiple respective entity records, the identified location information describing each of the respective physical space profile features, each physical space profile feature defining a geometry or attribute of the real-world entity represented by one or more data values included in at least one of the multiple entity records for the file layer.

5. The method of claim 4, wherein executing the parsing function to identify location information comprises:
   generating a query string for the parsing function; and
   analyzing one or more of the multiple respective entity records to identify location information based on the query string, the location information relating to a particular graphical object.

6. The method of claim 5, wherein the particular graphical object at least partially defines a physical space profile feature of the real-world entity, and wherein the query string is at least partially descriptive of the particular graphical object.

7. The method of claim 1, wherein the respective physical space profile feature comprises at least one of:
   i) a dimension of a room included in the virtual floorplan that represents the physical space;
   ii) a description of the room included in the virtual floor plan that represents the physical space; and
   iii) an asset assigned to the room.

8. A computing system,
comprising: one or more processing devices;
one or more non-transitory machine-readable storage devices storing instructions that are executable by the one or more processing devices to cause performance of operations comprising:
   receiving, at a location interpreter module of a first system, a drawing file comprising a plurality of file layers;
   storing the drawing file in a memory of the first system;
   processing contents of the drawing file after storing the drawing file; for each file layer of the plurality of file layers:
      identifying multiple entity records included at the file layer in response to processing the contents of the drawing file, each entity record comprising discrete data values used to render physical location attributes for real-world entities of a digital geographic structure;
      extracting, by the location interpreter module, data values of location information included in one or more of the multiple entity records for the file layer, each extracted data value corresponding to a respective physical space profile feature for a real-world entity of the digital geographic structure, and wherein at least one file layer corresponds to a virtual floorplan that represents a physical space of a real-world geographic structure that corresponds to the digital geographic structure;
      transmitting, from the first system and to a second, different system, the extracted data values, wherein the second system is configured to manage data structures of a location hierarchy that are mapped to the real-world entities of the digital geographic structure; and
      modifying, by a mapping module of the second system, information stored in a first data structure of the location hierarchy based on the extracted data values for the physical space profile feature of the real-world entity.

9. The computing system of claim 8, wherein modifying the information stored in the first data structure of the location hierarchy comprises:
   determining whether the real-world entity for which the data values were extracted matches an entity stored in the location hierarchy based on entity information included in the first data structure of the location hierarchy; and
   in response to determining that the real-world entity matches the entity stored in the location hierarchy, modifying the information stored in the first data structure by associating, in the second system, the extracted data values for the physical space profile feature of the real-world entity with the entity information.

10. The computing system of claim 9, wherein the operations comprise:
   determining whether the real-world entity for which the data values were extracted matches an entity stored in the location hierarchy based on entity information included in the first data structure of the location hierarchy;
   in response to determining that the real-world entity for which the data values were extracted does not match the entity stored in the location hierarchy, generating, in the second system, a second data structure of the location hierarchy; and
   associating the extracted data values for the physical space profile feature of the real-world entity with entity information of the location hierarchy by storing the extracted data values in the second data structure.

11. The computing system of claim 8, wherein extracting the data values of location information included in one or more of the multiple entity records for the file layer comprises:
   executing a parsing function to identify location information included in multiple respective entity records, the identified location information describing each of the respective space profile features, each space profile feature defining a geometry or attribute of the real-world entity represented by one or more data values included in at least one of the multiple entity records for the file layer.

12. The computing system of claim 11, wherein executing the parsing function to identify location information comprises:
   generating a query string for the parsing function; and
   analyzing one or more of the multiple respective entity records to identify location information based on the query string, the location information relating to a particular graphical object.

13. The computing system of claim 12, wherein the particular graphical object at least partially defines a physical space profile feature of the real-world entity, and wherein the query string is at least partially descriptive of the particular graphical object.

14. The computing system of claim 8, wherein the respective physical space profile feature comprises at least one of:
   i) a dimension of a room included in the virtual floorplan that represents the physical space;
   ii) a description of the room included in the virtual floor plan that represents the physical space; and
   iii) an asset assigned to the room.

15. One or more non-transitory machine-readable storage devices storing instructions that are executable by one or more processing devices to cause performance of operations comprising:
   receiving, at a location interpreter module of a first system, a drawing file comprising a plurality of file layers;
   storing the drawing file in a memory of the first system;
   processing contents of the drawing file after storing the drawing file;
   for each file layer of the plurality of file layers:
      identifying multiple entity records included at the file layer in response to processing the contents of the drawing file, each entity record comprising discrete data values used to render physical location attributes for real-world entities of a digital geographic structure;
      extracting, by the location interpreter module, data values of location information included in one or more of the multiple entity records for the file layer, each extracted data value corresponding to a respective physical space profile feature for a real-world entity of the digital geographic structure, and wherein at least one file layer corresponds to a virtual floorplan that represents a physical space of a real-world geographic structure that corresponds to the digital geographic structure;

transmitting, from the first system and to a second, different system, the extracted data values, wherein the second system is configured to manage data structures of a location hierarchy that are mapped to the real-world entities of the digital geographic structure; and modifying, by a mapping module of the second system, information stored in a first data structure of the location hierarchy based on the extracted data values for the physical space profile feature of the real-world entity.

16. The machine-readable storage devices of claim 15, wherein modifying the information stored in the first data structure of the location hierarchy comprises:

determining whether the real-world entity for which the data values were extracted matches an entity stored in the location hierarchy based on entity information included in the first data structure of the location hierarchy; and in response to determining that the real-world entity matches the entity stored in the location hierarchy, modifying the information stored in the first data structure by associating, in the second system, the extracted data values for the physical space profile feature of the real-world entity with the entity information.

17. The machine-readable storage devices of claim 15, wherein extracting the data values of location information included in one or more of the multiple entity records for the file layer comprises:

executing a parsing function to identify location information included in multiple respective entity records, the identified location information describing each of the respective space profile features, each space profile feature defining a geometry or attribute of the real-world entity represented by one or more data values included in at least one of the multiple entity records for the file layer.

18. The machine-readable storage devices of claim 17, wherein executing the parsing function to identify location information comprises:

generating a query string for the parsing function; and analyzing one or more of the multiple respective entity records to identify location information based on the query string, the location information relating to a particular graphical object.

* * * * *